United States Patent
Wang et al.

(10) Patent No.: US 11,552,161 B2
(45) Date of Patent: Jan. 10, 2023

(54) DISPLAY PANELS AND METHODS FOR MANUFACTURING THE SAME

(71) Applicant: YUNGU (GU'AN) TECHNOLOGY CO., LTD., Langfang (CN)

(72) Inventors: Xinnan Wang, Kunshan (CN); Rusheng Liu, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 205 days.

(21) Appl. No.: 16/746,985

(22) Filed: Jan. 20, 2020

(65) Prior Publication Data

US 2020/0161410 A1 May 21, 2020

Related U.S. Application Data

(63) Continuation of application No. PCT/CN2019/082086, filed on Apr. 10, 2019.

(30) Foreign Application Priority Data

Jul. 24, 2018 (CN) .......................... 201810816169.2

(51) Int. Cl.
*H01L 27/32* (2006.01)
*H01L 51/52* (2006.01)
*H01L 51/56* (2006.01)

(52) U.S. Cl.
CPC ...... *H01L 27/3279* (2013.01); *H01L 27/3246* (2013.01); *H01L 51/5228* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS 7,843,121 B2   11/2010   Qian et al.
2014/0346459 A1*  11/2014   Song ................... H01L 27/3279
                                                                        438/34
2014/0353597 A1   12/2014   Ahn
(Continued)

FOREIGN PATENT DOCUMENTS

CN       101042971 A      9/2007
CN       104393188 A      3/2015
(Continued)

OTHER PUBLICATIONS

CN First Office Action dated Mar. 19, 2020 in the corresponding CN application(application No. 201810816169.2).

*Primary Examiner* — Ratisha Mehta
(74) *Attorney, Agent, or Firm* — Kilpatrick Townsend & Stockton

(57) ABSTRACT

The present disclosure provides display panels and methods for manufacturing the same. The display panel includes a pixel definition layer, a cathode, and a compensation electrode. The pixel definition layer defines a plurality of pixel definition openings and a spacing region located between two adjacent pixel definition openings of the plurality of pixel definition openings. The cathode covers the pixel definition layer. The compensation electrode is located in the spacing region. The pixel definition layer covers the compensation electrode and defines a contact hole, the cathode and the compensation electrode are connected via the contact hole.

16 Claims, 4 Drawing Sheets

(56) References Cited

U.S. PATENT DOCUMENTS

| | | | |
|---|---|---|---|
| 2015/0128855 A1* | 5/2015 | Kinoshita | H01L 51/5212 |
| | | | 118/500 |
| 2015/0144902 A1* | 5/2015 | Do | H01L 51/5228 |
| | | | 257/40 |
| 2015/0280170 A1 | 10/2015 | Harikrishna et al. | |
| 2016/0035813 A1 | 2/2016 | Lee et al. | |
| 2016/0155790 A1* | 6/2016 | Lee | H01L 51/56 |
| | | | 438/34 |
| 2016/0359136 A1 | 12/2016 | Song | |
| 2017/0317299 A1* | 11/2017 | Choi | H01L 51/0097 |
| 2018/0006098 A1* | 1/2018 | Hong | H01L 27/3262 |
| 2018/0019434 A1* | 1/2018 | Park | H01L 27/3209 |
| 2018/0120490 A1* | 5/2018 | Hwang | G09G 3/3225 |
| 2018/0261797 A1* | 9/2018 | Lee | H01L 27/3216 |
| 2019/0103449 A1* | 4/2019 | Hou | H01L 27/3283 |
| 2019/0165305 A1* | 5/2019 | Zhang | H01L 27/3279 |

FOREIGN PATENT DOCUMENTS

| | | |
|---|---|---|
| CN | 104466021 A | 3/2015 |
| CN | 104752439 A | 7/2015 |
| CN | 104952904 A | 9/2015 |
| CN | 106992204 A | 7/2017 |
| CN | 108258153 A | 7/2018 |
| CN | 109004005 A | 12/2018 |

\* cited by examiner

DISPLAY PANELS AND METHODS FOR MANUFACTURING THE SAME

CROSS-REFERENCES TO RELATED APPLICATIONS

This application is a continuation application for International Application PCT/CN2019/082086, filed on Apr. 10, 2019, which claims priority to Chinese Patent Applications No. 2018108161692, entitled "IMPACT-RESISTANT ORGANIC LIGHT-EMITTING DIODE DISPLAY PANEL", filed on Jul. 24, 2018. The contents of these applications are incorporated by reference herein for all purposes.

TECHNICAL FIELD

The present disclosure relates to the technical field of display.

BACKGROUND

With the development of big data, cloud computing, and mobile Internet, intelligent mobile communication terminals, wearable devices, and smart home appliances have become an indispensable part of people's work and life. As an important window for implementing human-device interaction in intelligent devices, the display panel is also undergoing significant changes. Organic Light-Emitting Diode (OLED) display panel has the advantages of thin thickness, self-light-emitting, low power consumption, and flexibility.

SUMMARY

The present disclosure provides display panels and methods for manufacturing the same, which can improve the bending-resistance strength and impact-resistance strength of the display panel.

The present disclosure provides a display panel, including: a pixel definition layer defining a plurality of pixel definition openings and a spacing region located between two adjacent pixel definition openings of the plurality of pixel definition openings; a cathode covers the pixel definition layer; a compensation electrode located in the spacing region; and the pixel definition layer covers the compensation electrode and define at least a contact hole, the cathode and the compensation electrode are connected via the contact hole.

Optionally, a side of the compensation electrode and a side of the pixel definition opening has a preset distance therebetween, and the compensation electrode and the cathode are connected to each other via the contact hole to form a three-dimensional mesh structure.

Optionally, the display panel defines a plurality of contact holes, a density of a distribution of the contact holes defined in a middle region of the display panel is greater than that of contact holes defined in a frame region of the display panel away from the middle region.

Optionally, the display panel further includes an array substrate and an anode formed on the array substrate, the pixel definition layer covers at least a part of an edge of the anode and forms the plurality of pixel definition openings filled with organic light-emitting units.

Optionally, a distance between a surface of the compensation electrode facing to the array substrate and the array substrate is equal to a distance of a surface of the anode facing to the array substrate and the array substrate.

Optionally, a distance between a surface of the compensation electrode facing to the array substrate and the array substrate is greater than a distance between a surface of the anode away from the array substrate and the array substrate.

Optionally, the pixel definition layer includes a first pixel definition layer and a second pixel definition layer that are stacked one by one; the first pixel definition layer is formed on the array substrate, and the compensation electrode is formed on the first pixel definition layer; and the second pixel definition layer covers the compensation electrode and forms the contact hole exposing at least a part of the compensation electrode.

Optionally, an orthographic projection of the pixel definition layer on the array substrate covers an orthographic projection of the compensation electrode on the array substrate.

Optionally, the cathode and the compensation electrode are at least partly overlapped, an overlapping region between the cathode and the compensation electrode is non-transparent.

Optionally, a distance between a part of an upper surface of the pixel definition layer corresponding to the compensation electrode and the array substrate is greater than a distance between a rest upper surface of the pixel definition layer and the array substrate.

Optionally, the contact hole has a first end away from the compensation electrode and a second end adjacent to the compensation electrode; and a radial dimension of the contact hole gradually decreases from the first end to the second end.

Optionally, the radial dimension of the contact hole varies stepwise from the first end to the second end.

Optionally, the compensation electrode and the cathode are made of the same or different materials, and the pixel definition layer is an organic material layer.

Optionally, the array substrate includes a planarization layer, the anode is formed on the planarization layer, and a distance from the planarization layer to an upper surface of the pixel definition layer away from the array substrate is greater than a distance from the planarization layer to an upper surface of the anode away from the array substrate.

Optionally, a distance between a surface of the compensation electrode facing to the planarization layer and the planarization layer is greater than a distance between a surface of the anode away from the planarization layer and the planarization layer.

The present disclosure further provides a method for manufacturing a display panel, the display panel includes a plurality of pixel definition opening regions and a spacing region located between two adjacent pixel definition opening regions of the plurality of pixel definition opening regions, the method for manufacturing the display panel includes: forming a compensation electrode in the spacing region; forming a pixel definition layer covering the compensation electrode and defining the pixel definition openings, the pixel definition layer has a contact hole exposing at least a part of the compensation electrode; and forming a cathode covering the pixel definition layer, and contacting the cathode with the compensation electrode via the contact hole.

Optionally, the forming the compensation electrode in the spacing region includes: forming the compensation electrode in the spacing region by evaporation or printing.

Optionally, the forming the pixel definition layer covering the compensation electrode and defining the pixel definition opening includes: forming the pixel definition layer by coating or inkjet printing, and patterning the pixel definition layer to form the pixel definition openings and the contact hole.

Optionally, patterning the pixel definition layer includes exposing the pixel definition layer with a mask and developing the same.

Optionally, the method for manufacturing the display panel further includes: providing an array substrate; and forming an anode on the array substrate, and the anode corresponding to the pixel definition opening region.

According to the display panels and methods for manufacturing the same, when the display panel is impacted or bent for multiple times, the film encapsulation layer will be bent downward in the direction of the impacting force and transfer the impacting force to the cathode. The compensation electrode and the cathode are in contact with each other via the contact hole to form a three-dimensional mesh structure to support the cathode and disperse the impacting stress, thereby preventing the cathode from being broken or separated from the organic light-emitting unit, thereby effectively avoiding display defects or display failure due to damage of the cathode. Therefore, the bending-resistance strength and impact-resistance strength of the display panel are improved.

DETAILED DESCRIPTION OF THE INVENTION

Figure 1:
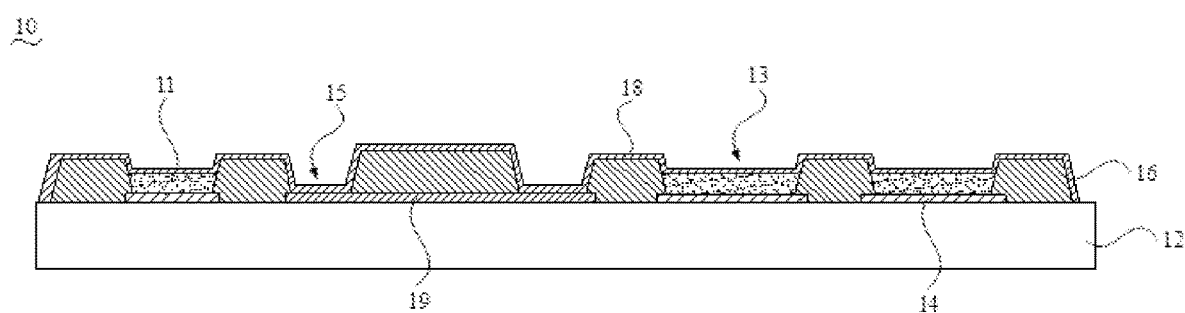
FIG. 1 is a schematic diagram of a display panel according to an embodiment of the present disclosure.

In order to achieve better visual and touch experience, the requirements as on the effective display area and thickness of OLED display panel are increasingly higher. But with the increase of effective display area and thinning of thickness, the intensity of OLED display panel decreases. Especially, when the flexible OLED display panel is bent/curled repeatedly or dropped and impacted, the stress concentration cannot be dispersed, resulting in the damage of anode, OLED light-emitting device, and cathode.

The bending region and impacted region cannot be fully displaying and are likely to have bad display such as dark spots, bright spots, and color spots, etc.

The present disclosure is described in details in combination with the accompanying drawings and embodiments such that the purpose, technical solution and advantages of the present disclosure are more apparent. It should be understood that the particular embodiments are described for the purpose of comprehending the present disclosure more fully and completely.

The OLED display panel is widely used for its good flexibility. One of the advantages of OLEDs over TFT-LCD is that they can be used to produce collapsible/flexible products. To achieve the flexibility of the OLED display panel, a flexible substrate must be used first, and then the thin film encapsulation (TFE) is more suitable for the OLED display panel than the widely used glass cover package.

Typically, in a thin film encapsulation structure, the thin film encapsulation layer flatly covers the cathode layer and is in contact with the array layer of the display panel in a frame region other than the active area. However, as restricted by structure and material, the bending-resistance strength and impact-resistance strength of OLED panel are weak.

Take the drop impact test as an example, when using a drop ball (a steel ball of 20 mm diameter; the dropping height is 2 cm to 62.5 cm) of 32.65 g to drop onto the OLED display panel, the film encapsulation layer will bend downward in the direction of the impacting force, thereby transferring stress to the structure in the thin film encapsulation layer. Because the stress concentration at the moment of hitting by the dropping ball cannot be dispersed, when the dropping height is more than 10 cm, the OLED display panel is vulnerable to be damaged, which may cause the hit region to be unable to display in full color. It is easy to result in black spot, bright spot, and color spot.

Therefore, the buffer layer is usually prepared on the light-emitting side away from the screen. For example, optically clear adhesive is filled between the display panel and the overlay plate. It would increase the thickness of the screen, fail to provide favorable visual and touch experiences, and increase the difficulty of the manufacturing process.

The present disclosure provides a display panel that can ensure the thickness in an acceptable dimension, and the display effect of the display panel performs well, and has a relatively good bending-resistance strength and impact-resistance strength.

An OLED display panel includes an array substrate, an anode located on the array substrate, an OLED light-emitting device, and a cathode. The light-emitting principle of OLED is that the semiconductor material and organic light-emitting material are driven by electric field and lead to light-emission by carrier injection and composition. Specifically, under a certain voltage drive, electrons and holes are injected from the cathode and anode respectively and migrated to the OLED light-emitting device, and then form the excitons. The excitons transmit the light-emitting energy to the light-emitting molecules, stimulate the electrons in the light-emitting molecules to transition from the ground state to the excited state, and again the electrons transition from the excited state back to the ground state and emit visible light.

In the OLED display panel, the TFT array circuit controls whether or not each sub-pixel emits light. Each sub-pixel corresponds to an anode, and the cathode covers the entire pixel definition layer to provide electrons for the OLED light-emitting device. When the OLED display panel is impacted or bent for multiple times, the thin film encapsulation layer will be bent downwardly in the direction of the impacting force, and the probability of cathode being hit is almost 100%, which may cause the film of the cathode to be broken, or the separation of the OLED light-emitting device from the cathode or anode, resulting in display defects.

According to the embodiment of the present disclosure, a compensation electrode is provided to effectively disperse the stress when the cathode is impacted or bent, thereby avoiding the cathode being broken or separated from the organic light-emitting unit, and effectively improving the bending-resistance strength and the impact-resistance strength of the OLED display panel.

The display panel provided according to an embodiment of the present disclosure is mainly applied to a full screen or a frameless display panel, and may also be applied to a display panel with a frame or a narrow frame.

Figure 2:
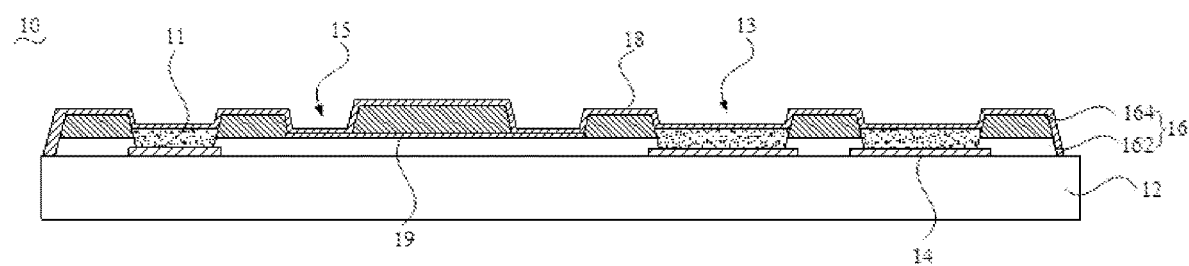
FIG. 2 is a schematic diagram of a display panel according to another embodiment of the present disclosure.

FIG. 1 shows a schematic diagram of a display panel according to an embodiment of the present disclosure. FIG. 2 shows a schematic diagram of a display panel according to another embodiment of the present disclosure. For ease of description, the accompanying drawings show only structures related to the embodiments of the present disclosure.

The display panel 10 includes a pixel definition layer 16, a cathode 18, and a compensation electrode 19. Optionally, the display panel 10 further includes an array substrate 12 and an anode (pixel electrode 14).

The array substrate 12 includes a underlay substrate and a thin film transistor (not shown) located on the underlay substrate. The underlay substrate is made of, for example, polyimide (PI) materials. The array substrate 12 may further include a film layer such as a planarization layer or a passivation layer, which is not limited hereto.

The anode, i.e., the pixel electrode 14, is formed on the array substrate 12. For ease of description, the following will be described taking the pixel electrode 14 as an example. The array substrate 12 has a plurality of sub-pixel regions. For example, the array substrate has a first sub-pixel region emitting red light, a second sub-pixel region emitting blue light, and a third sub-pixel region emitting green light. A set of a first sub-pixel region, a second sub-pixel region, and a third sub-pixel region may form a pixel region.

Each pixel region may further include other sub-pixel regions, which is not limited hereto. For example, each pixel region may also include a fourth sub-pixel region that emits white light.

The pixel electrode 14 may be a transparent electrode, a translucent electrode, or a reflective electrode. For example, when the pixel electrode 14 is a transparent electrode, the pixel electrode 14 may contain one or more materials of, for example, indium tin oxide (ITO), indium zinc oxide (IZO), zinc oxide, indium trioxide, indium potassium oxide, or aluminum zinc oxide. When the pixel electrode 14 is a reflective electrode, the pixel electrode 14 may include one or more materials of silver, magnesium, aluminum, platinum, gold, nickel, or the like.

The pixel definition layer 16 is formed on the array substrate 12 and exposes at least a part of each pixel electrode 14. For example, the pixel definition layer 16 may cover at least part of the edge of each pixel electrode 14, thereby exposing at least part of each pixel electrode 14. Thus, the pixel definition layer 16 defines a plurality of pixel definition openings 13 and a spacing region (not shown) between the adjacent pixel definition openings 13. Each pixel definition opening 13 exposes a central portion of the pixel electrode 14 or the entire pixel electrode 14.

Thus, a distance between each pixel electrode 14 and the opposite electrode (cathode 18) formed on each pixel electrode 14 may be increased due to the pixel definition layer 16, and antireflection occurring at the end of the pixel electrode 14 may be prevented.

For example, the pixel electrode 14 may be formed on a planarization layer, and the distance from the planarization layer to the upper surface of pixel definition layer 16 away from the array substrate 12 is greater than the distance from the planarization layer to the upper surface of the pixel electrode 14 away from the array substrate 12. The pixel definition layer 16 may cover at least a part of the edge of each pixel electrode 14 to form a plurality of pixel definition openings 13, and an organic light-emitting unit 11 is filled in two adjacent pixel definition openings 13 of the plurality of pixel definition openings 13.

The cathode 18 may cover an entire side of the pixel definition layer 16 away from the array substrate 12. The cathode 18 can be made of metal or metal compound or alloy material with lower power function, such as silver, lithium, magnesium, calcium, strontium, aluminum, and indium. The cathode 18 may cover the spacing region located between the organic light-emitting unit 11 in the pixel definition opening 13 and the pixel definitions openings 13 by evaporation.

In the embodiment of the present disclosure, the compensation electrode 19 is located in the spacing region located between two adjacent pixel definition openings 13 of the plurality of pixel definition openings 13. The pixel definition layer 16 covers the compensation electrode 19, and the pixel definition layer 16 has a contact hole 15. The cathode 18 is connected to the compensation electrode 19 via the contact hole. The compensation electrode 19 is located in the spacing region, for example, it may be arranged on a plane surrounding each pixel definition opening 13, or it may be arranged on one side, both sides, or three sides of the pixel definition opening 13, or it may be arranged in a region between two adjacent pixel definition openings 13. In order not to affect the opening ratio of the display panel 10, a preset distance should be kept between the side of the compensation electrode 19 and the side of the pixel definition opening 13.

The pixel definition layer 16 covers the compensation electrode 19, and the cathode 18 covers the pixel definition layer 16, that is, the compensation electrode 19 is formed below the cathode 18. The pixel definition layer 16 has the contact hole 15 that can expose the compensation electrode 19 below the cathode 18, so that when the cathode 18 is subsequently formed, the cathode 18 can be in contact with the compensation electrode 19.

The pixel definition layer 16 may be patterned by a patterning process to obtain the contact hole 15. For example, the pixel definition layer 16 may be subjected to mask exposure and then developed to form the contact hole 15. Optionally, the contact hole 15 may also be formed by etching. The patterning process may also be other processes, including but not limited to the illustrated two processes.

When the display panel 10 is impacted or bent for multiple times, the film encapsulation layer will be bent downward in the direction of the impacting force and transfer the impacting force to the cathode 18. The compensation electrode 19 and the cathode 18 are in contact with each other via the contact hole 15 to form a three-dimensional mesh structure to support the cathode 18 and disperse the impacting stress, thereby preventing the cathode 18 from being broken or separated from the organic light-emitting unit, thereby effectively avoiding display defects or display failure due to damage of the cathode 18.

Therefore, the display panel of the embodiment of the present disclosure improves the bending-resistance strength and impact-resistance strength of the display panel 10.

The number of contact holes 15 may be determined on a case-by-case basis and is not limited hereto. For example, the density of the contact holes 15 may be appropriately increased for a central region where the display panel 10 is susceptible to impact, and the density of the contact holes 15 may be appropriately reduced for an area adjacent to the frame.

The shape of the contact hole 15 may be circular, square, rectangular or other, which is not limited hereto, as long as the cathode 18 can be in contact with the compensation electrode 19 after subsequent evaporation of the cathode 18.

The compensation electrode 19 may be of the same material or different materials as the cathode 18. For example, the material of the compensation electrode 19 is the same as the material of the cathode 18, for example, may be a metal or metal compound or alloy having a lower power function such as silver, lithium, magnesium, calcium, strontium, aluminum, and indium.

Top-emitting OLED device can significantly improve the opening ratio of OLED device and the pixel PPI (Pixel Per Inch, per inch pixel) density. The cathode 18 usually adopts transparent electrode with lower power function, such as silver and magnesium, which has higher $R_S$ resistance and affects the uniformity of display brightness of display panel 10. By setting the compensation electrode 19 and the cathode 18 to be in contact with each other, the upper and lower layer electrodes are formed, which can effectively reduce the resistance of the cathode 18, improve the conductivity of the cathode 18, reduce the power consumption of the OLED display panel 10, reduce the IR-Drop of the cathode 18, improve the uniformity of display brightness of the display panel 10, and improve the quality of the display panel 10.

The pixel definition layer 16 is an organic material layer. For example, the pixel definition layer 16 is made of one or more materials of polyimide, polyamide, phenylcyclobutene, acrylic resin, or phenolic resin. After a plurality of pixel electrodes 14 are formed in the planarization layer, a pixel definition layer 16 is formed on the planarization layer by coating or inkjet printing, and a plurality of pixel definition openings 13 and the foregoing contact holes 15 are patterned. The pixel definition layer 16 covers the compensation electrode 19, the cathode 18 covers the pixel definition layer 16, and the pixel definition layer 16 is a layer of organic material, which has certain flexibility, can play a cushion function, and release a part of stress, and further reduce the influence of bending or impact on the cathode 18.

The pixel definition layer 16 may also include inorganic materials, such as tin oxide, silicon nitride and/or tin oxynitride, or doped with some nano-inorganic particles. For one thing, it can reduce the expansion coefficient of the pixel definition layer 16, for another thing, it can increase the binding force of the pixel definition layer 16 to other film layers. For example, the binding force of the pixel definition layer 16 to the planarization layer and the inorganic layer in the encapsulation layer is increased, thereby avoiding, to some extent, the phenomenon of separation of film layers and improving the reliability of the display panel 10.

An orthographic projection of the pixel definition layer 16 on the array substrate 12 covers the orthographic projection of the compensation electrode 19 on the array substrate 12. Therefore, it can be ensured that the compensation electrode 19 does not affect the pixel opening ratio of the display panel 10. In order to reduce the resistance as much as possible without affecting the opening ratio, the area of the compensation electrode 19 can be selected according to the actual situation. For example, the influence of the resistance of the cathode 18 on the small-sized display panel 10 is less than that of the large-sized display panel 10, therefore the compensation electrode 19 may be provided only on one or both sides of each pixel definition opening 13.

The compensation electrode 19 and the pixel electrode 14 are located on the same layer, in other words, a distance between the a surface of the compensation electrode 19 facing the array substrate 12 and the array substrate 12 is equal to a distance between a surface of the pixel electrode 14 facing the array substrate 12 and the array substrate 12. For example, after the pixel electrode 14 is formed on the planarization layer, the patterned cathode 18 is formed by photolithography and evaporation in the spacing region of the planarization layer. The compensation electrode 19 and the pixel electrode 14 are in the same layer, which can reduce the number of mask processes, thus simplifying the process and reducing the cost.

In the manufacturing process of the display panel, due to the restriction of the manufacturing process, if the compensation electrode 19 and the pixel electrode 14 are located on the same layer, it may result in display defects and affect the opening ratio of the pixel definition opening 13. The distance between the surface of the compensation electrode 19 facing the array substrate 12 and the array substrate 12 is greater than the distance between the surface of the pixel electrode 14 away from the array substrate 12 and the array substrate 12, that is, the compensation electrode 19 and the pixel electrode 14 are not on the same layer. The distance between the surface of the compensation electrode 19 facing the planarization layer and the planarization layer is greater than the distance between the surface of the pixel electrode 14 away from the planarization layer and the planarization layer.

Referring to FIG. 2, the pixel definition layer 16 includes a first pixel definition layer 162 and a second pixel definition layer 164 stacked one by one. The first pixel definition layer 162 is formed on the array substrate 12. The compensation electrode 19 is formed on a side of the first pixel definition layer 162 away from the array substrate 12. The second pixel definition layer 164 covers the compensation electrode 19, and the second pixel definition layer 164 forms the contact hole 15 for exposing at least a part of the compensation electrode 19.

The first pixel definition layer 162 may firstly be formed on the planarization layer, and the first pixel definition layer 162 may cover at least a part of the edge of each pixel electrode 14 to define the plurality of first pixel definition sub-openings. The compensation electrode 19 is then formed in the spacing region on the first pixel definition layer 162, and then the second pixel definition layer 164 is formed on the first pixel definition layer 162, so that the second pixel definition layer 164 covers the compensation electrode 19. The second pixel definition layer 164 defines a plurality of second pixel definition sub-openings, and the second pixel definition sub-openings are in one-to-one correspondence with the first pixel definition sub-openings, thereby defining the foregoing pixel definition openings 13, thereby enabling the pixel definition opening 13 to expose a central portion of the pixel electrode 14 or the entire pixel electrode 14.

The second pixel definition layer 164 may be patterned by steps of exposing and developing to form the foregoing contact hole 15, so that the cathode 18 and the compensation electrode 19 may be in contact.

Therefore, it is possible to avoid display defects caused by the pixel electrode 14 and the compensation electrode 19 being on the same layer.

When the pixel electrode 14 and the compensation electrode 19 are located in the same layer, due to f the compensation electrode 19, the contact area of the pixel definition layer 16 in contact with the planarization layer decreases, compared with that when no compensation electrode 19 is provided. The film layers are attached to each other by the Van der Waals force, so the reduction of the contact area reduces the adhesion between the planarization layer and the pixel definition layer 16.

When the pixel electrode 14 and the compensation electrode 19 are not located in the same layer, for example, the first pixel definition layer 162 is in contact with the planarization layer entirely, then the contact area of the planarization layer in contact with the first pixel definition layer 162 is large. The adhesion between the planarization layer and the first pixel definition layer 162 is relatively high, and the materials of the first pixel definition layer 162 and the second pixel definition layer 164 are the same, and the binding force is favorable. Therefore, when the display panel 10 is subjected to drop impact or bending, the possibility of display defects due to separation of the film layers is effectively reduced.

The distance between a part of the upper surface of the pixel definition layer 16 corresponding to the compensation electrode 19 and the array substrate 12 is greater than the distance between a rest upper surface of the pixel definition layer 16 and the array substrate 12. Further, as the pixel definition layer 16 is formed on the planarization layer entirely, the part of the upper surface of the pixel definition layer 16 corresponding to the compensation electrode 19 protrudes with respect to rest of the pixel definition layer 16.

When the display panel 10 is bent or impacted many times, the encapsulation layer will be bent downwardly in the direction of the impacting force, thereby transmitting the bending force or the impacting force downwardly, and inevitably affecting the organic light-emitting unit 11. For example, the light-emitting mechanism of the organic light-emitting unit 11 may be changed, for example, the electron-hole pairs that could have been composited could not be effectively composited due to extrusion, so that excitons could not be produced, thereby affecting light-emitting efficiency; or a composite electron-hole pair changes exciton transition orbits due to the extrusion, resulting in a change in photon energy and a change in luminous color. Further, the film layer can be damaged, broken, and separated from each other, resulting in display failure.

Since the upper surface of pixel definition layer 16 corresponding to the compensation electrode 19 form protrusions relative to rest of the pixel definition layer 16, the upper surface of pixel definition layer 16 corresponding to the compensation electrode 19 first withstands stress due to bending or impact force transmitted by the impact, thereby effectively protecting the organic light-emitting unit 11 located in the pixel definition opening 13, effectively avoiding separation of the pixel electrode 14 and/or the cathode 18 from the organic light-emitting unit 11, and further improving the bending-resistance strength and impact-resistance strength of the OLED display panel 10.

In some embodiments of the present disclosure, in the direction perpendicular to the display panel 10, the cathode 18 and the compensation electrode 19 are at least partly overlapped, an overlapping region between the cathode 18 and the compensation electrode 19 is non-transparent.

In order to prevent a decrease in contrast due to reflection of external light, a polarizer is usually attached to the light-emitting side of the OLED display panel. The external light becomes linearly polarized light after passing through the polarizer. When the linearly polarized light is emitted through the emitter electrode of the thin film transistor (TFT) and then emitted to the polarizer, the linearly polarized light becomes linearly polarized light perpendicular to the polarization direction of the polarizer. Therefore, it is impossible for the linearly polarized light to enter the human eye through the polarizer. This ensures the contrast of OLED display panel 10 outdoor and improves the display effect.

The light emitted by the OLED device does not emit in the direction perpendicular to the array substrate 12, and some of the light is emitted from the side of the OLED device. After being reflected by the reflection electrode of the thin film transistor, some light will be emitted from the spacing region of the pixel definition layer 16 into the polarizer and received by the human eye. Therefore, the contrast of OLED display panel 10 is reduced to some extent, which affects the display effect.

The cathode and the compensation electrode are at least partly overlapped, when an overlapping region between the cathode 18 and the compensation electrode 19 is non-transparent, for example, translucent or opaque, after some of the light emitted by the OLED device is reflected by the reflection electrode of the thin film transistor, the overlapping region of the cathode 18 in contact with the compensation electrode 19 can prevent the light from being emitted. Therefore, the contrast of the display panel 10 is improved and the display effect is ensured.

The contact hole 15 has a first end away from the compensation electrode 19 and a second end adjacent to the compensation electrode 19. The radial dimension of the contact hole 15 gradually decreases from the first end to the second end. Therefore, during subsequent deposition of cathode 18 by evaporation or inkjet printing, the cathode 18 can be better covering the contact hole 15 to ensure good contact between the cathode 18 and the compensation electrode 19.

The radial dimension of the contact hole 15 gradually decreases from the first end to the second end. It is not limited that the aperture of the contact hole 15 are linearly changed. For example, optionally, the radial dimension of the contact hole 15 may decrease vary stepwise.

Embodiments of the present disclosure further provide a method for manufacturing a display panel.

Figure 3:
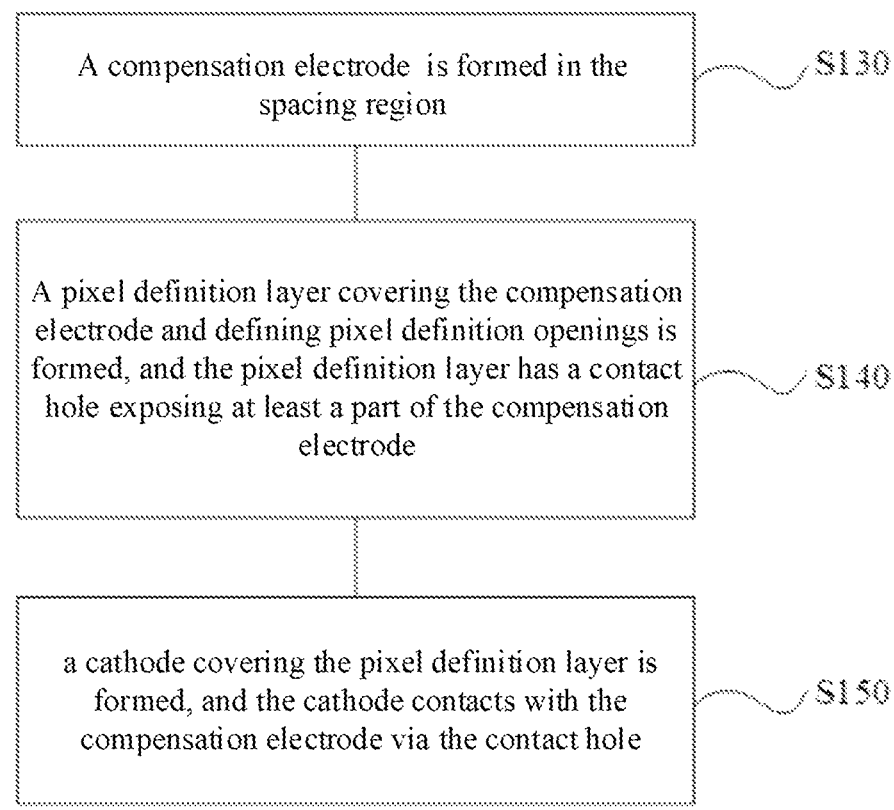
FIG. 3 is a flowchart of a method for manufacturing a display panel according to an embodiment of the present disclosure.

FIG. 3 shows a flowchart of a method for manufacturing a display panel according to an embodiment of the present disclosure.

The display panel 10 includes a plurality of pixel definition opening regions and a spacing region located in the sub-pixel definition opening regions. As shown in FIG. 3, the method for manufacturing a display panel according to an embodiment of the present disclosure includes the following steps.

At step S130, a compensation electrode 19 is formed in the spacing region.

Optionally, the compensation electrode 19 may be formed in the spacing region of the array substrate 12 by a process such as evaporation or printing. The compensation electrode 19 is located in the spacing region, for example, may be arranged to surround each pixel definition opening region, may be arranged on one side, both sides, or three sides of the pixel definition opening region, or may be arranged in a region between two adjacent pixel definition opening regions.

In order not to affect the pixel opening ratio of the display panel, a preset distance should be kept between the side of the compensation electrode and the side of the pixel definition opening.

At step S140, a pixel definition layer 16 covering the compensation electrode 19 and defining pixel definition openings 13 is formed, and the pixel definition layer 16 has a contact hole 15 exposing at least a part of the compensation electrode 19.

Optionally, the pixel definition layer 16 is an organic material layer, for example, a material of the pixel definition layer 16 is one or more of an organic material such as polyimide, polyamide, phenylpropene, acrylic resin, or phenolic resin. The pixel definition layer 16 may be formed on the array substrate 12 by coating or inkjet printing, and the pixel definition layer 16 is patterned to form a plurality of pixel definition openings 13.

The pixel definition opening region overlaps with the orthographic projection of the pixel definition opening 13 on the array substrate 12, that is, the pixel definition opening region may be a preset area. After the pixel definition layer 16 is formed, the side boundary of the pixel definition opening 13 is the side boundary of the pixel definition opening region.

The pixel definition layer 16 may be patterned by a patterning process to obtain the contact hole 15. For example, the pixel definition layer 16 may be subjected to mask exposure and then developed to form a contact hole 15. In other embodiments, the contact hole 15 may also be formed by etching. The patterning process may also be other processes, including but not limited to the two processes exemplified above.

Optionally, the pixel definition layer 16 may also include inorganic materials such as tin oxide, silicon nitride and/or tin oxynitride, or doped with some nano-inorganic particles.

At step S150, a cathode 18 covering the pixel definition layer 16 is formed, and the cathode 18 contacts with the compensation electrode 19 via the contact hole 15.

The cathode 18 may be covering the entire pixel definition layer 16, and a material of the cathode 18 is also formed in the contact hole 15, thereby contacting the cathode 18 with the compensation electrode 19. The cathode 18 can be made of metal or metal compound or alloy material with lower power function such as silver, lithium, magnesium, calcium, strontium, aluminum, and indium. The cathode 18 may be covering an organic light-emitting unit 11 in the pixel definition opening 13 and a spacing region located between two adjacent pixel definition openings 13 of the plurality of pixel definition openings 13 by means of evaporation.

Figure 4:
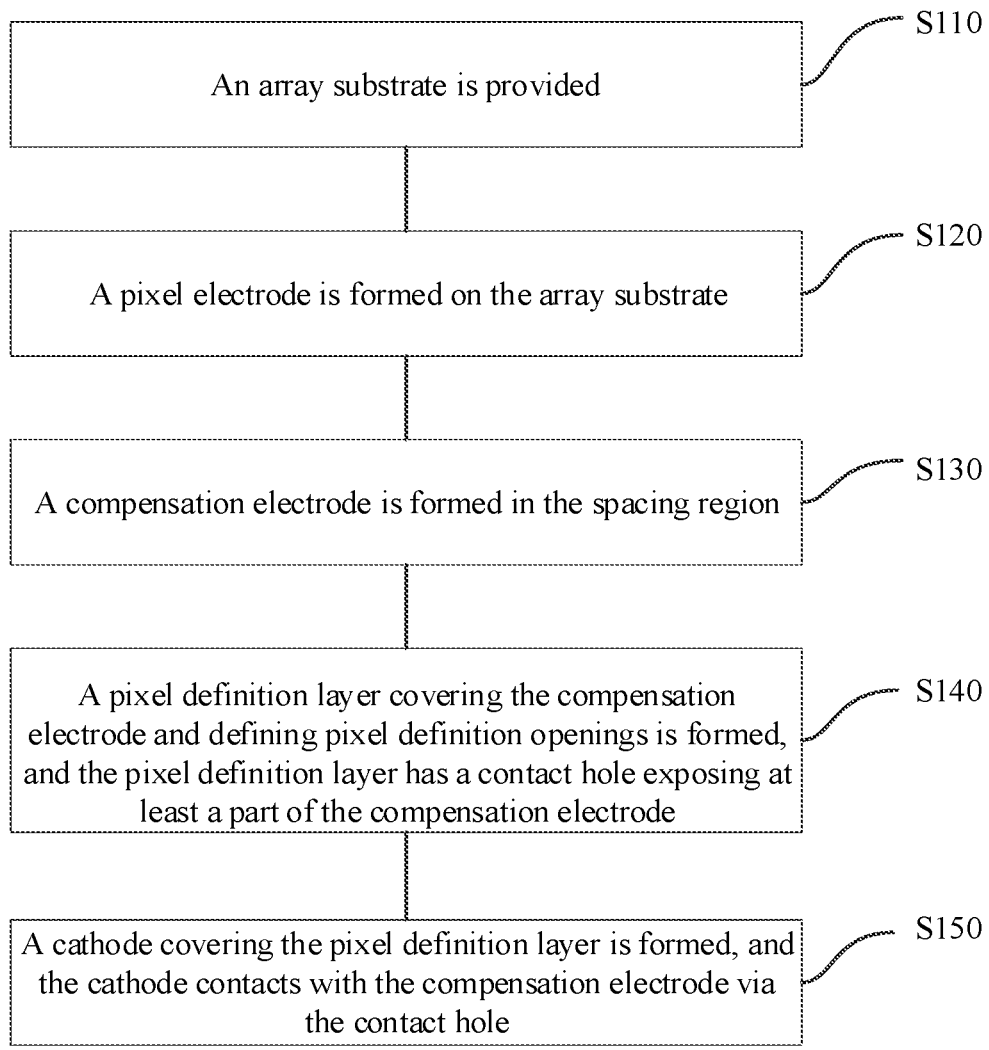
FIG. 4 is a flowchart of a method for manufacturing a display panel according to an embodiment of the present disclosure.

As shown in FIG. 4, the method for manufacturing a display panel further includes the following steps.

At step S110, an array substrate 12 is provided.

The array substrate 12 includes a underlay substrate and a thin film transistor.

The underlay substrate is formed on the carrier substrate. The underlay substrate is a flexible substrate that may be made of, for example, an organic polymer, silicon nitride, and silicon oxide. The organic polymer may be one or more of polyimide, polyamide, polycarbonate, polyphenylene ether sulfone, or the like. The underlay substrate may be obtained by coating the carrier substrate with polyimide glue and then curing the polyimide.

Thin film transistors are formed on underlay substrates. Additional film layers such as buffer layers may be formed on the underlay substrate before the thin film transistors are formed. The buffer layer may be formed on the entire surface of the underlay substrate, or may be patterned.

The buffer layer may have a layered structure formed of a suitable material from materials such as PET, PEN, polyacrylate and/or polyimide in the form of a monolayer or multilayer stack. The buffer layer may also be formed of silicon oxide or silicon nitride, or may include a composite layer of organic material and/or inorganic material.

Thin film transistors may control the emission of each sub-pixel, or may control the emission of each sub-pixel. Thin film transistors may include a semiconductor layer, a gate electrode, a source electrode, and a drain electrode. The semiconductor layer may be formed of an amorphous silicon layer, a metal oxide, or a polycrystalline silicon layer, or may be formed of an organic semiconductor material. Optionally, the semiconductor layer includes a trench region and a source region and a drain region doped with dopant.

A semiconductor layer may be covered by a gate insulating layer, and a gate electrode may be located on the gate insulating layer. The gate insulating layer may substantially cover the entire surface of the underlay substrate. The gate insulating layer may be patterned. Considering the adhesion with the neighboring layers, the formability and surface flatness of the target stacking layers, the gate insulating layer may be formed of silicon oxide, silicon nitride, or other organic or inorganic insulating materials. The gate electrode may be covered by an interlayer insulating layer formed of silicon oxide, silicon nitride, and/or other suitable organic or inorganic insulating material. A part of the gate insulating layer and the interlayer insulating layer may be removed to form a contact hole 15 exposing a predetermined region of the semiconductor layer. The source electrode and the drain electrode may contact the semiconductor layer via the contact hole 15.

Since the thin film transistor has a complex layer structure, its top surface may not be flat. The thin film transistor further includes a planarization layer to form a sufficiently flat top surface. After forming the planarization layer, a through hole may be formed in the planarization layer to expose the source and drain electrodes of the thin film transistor.

At step S120, a pixel electrode 14 is formed on the array substrate 12, and the pixel electrode 14 is in a one-to-one correspondence with the pixel definition opening 13.

A pixel electrode 14 (i.e., anode) is formed on the array substrate 12. The array substrate 12 may have a plurality of sub-pixel regions and a spacing region located between the sub-pixel regions. A sub-pixel corresponds to a sub-pixel region, such as a pixel electrode for emitting red light, a pixel electrode for emitting blue light, and a pixel electrode for emitting green light, respectively, formed in a sub-pixel region.

The pixel definition layer 16 is formed on the array substrate 12 and covers at least part of the edge of each pixel electrode 14, thereby exposing at least a part of each pixel electrode 14. Thus, the pixel definition layer 16 defines a plurality of pixel definition openings 13 and a spacing region located between two adjacent pixel definition openings 13 of the plurality of pixel definition openings 13, and the pixel definition openings 13 expose the middle portion or all of the pixel electrode 14.

The sequence of steps S130 and S140 can be changed. For example, the pixel definition layer 16 includes a first pixel definition layer 162 and a second pixel definition layer 164 stacked one by one. Firstly, a first pixel definition layer 162 may be formed on the planarization layer, and the first pixel definition layer 162 may cover at least a part of the edge of each pixel electrode 14 to define a plurality of first pixel definition sub-openings. The compensation electrode 19 is then formed in a spacing region on the first pixel definition layer 162, and then the second pixel definition layer 164 is formed on the first pixel definition layer 162, so that the second pixel definition layer 164 covers the compensation electrode 19 and forms a contact hole 15 exposing at least a part of the compensation electrode 19.

Based on the foregoing display panel 10, an embodiment of the present disclosure further provides a display device. The display device may be a display terminal, such as a tablet computer. Optionally, the display device may be a mobile communication terminal, such as a mobile phone.

The display device includes a display panel 10 and a control unit configured to transmit a display signal to the display panel 10.

When the display panel 10 is impacted or bent for multiple times, the film encapsulation layer will be bent downwardly in the direction of the impacting force and transfer the impacting force to the cathode 18. The compensation electrode 19 and the cathode 18 are in contact with each other via the contact hole 15 to form a three-dimensional mesh structure to support the cathode 18 and disperse the impacting stress, thereby avoiding fracture of the cathode 18 or separation from the organic light-emitting unit 11, thereby effectively avoiding display defects or failure due to damage of the cathode 18. Therefore, the bending-resistance strength and impact-resistance strength of the display panel 10 are improved.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

The invention claimed is:

1. A display panel, comprising:
   a pixel definition layer defining a plurality of pixel definition openings and a spacing region located between two adjacent pixel definition openings of the plurality of pixel definition openings;
   a cathode covering the pixel definition layer;
   a compensation electrode located in the spacing region; and
   an array substrate and an anode formed on the array substrate, the pixel definition layer covering at least a part of an edge of the anode and forming the plurality of pixel definition openings filled with organic light-emitting units;
   wherein a distance between a part of an upper surface of the pixel definition layer corresponding to the compensation electrode and the array substrate is greater than a distance between a rest upper surface of the pixel definition layer and the array substrate;
   wherein the pixel definition layer overlays the compensation electrode and defines at least a contact hole, and the cathode and the compensation electrode are connected via the contact hole to form a three-dimensional mesh structure for impact dispersion; and
   wherein the contact hole has a first end away from the compensation electrode and a second end adjacent to the compensation electrode, a radial dimension of the contact hole gradually decreases from the first end to the second end to provide enhanced contact between the cathode and the compensation electrode.

2. The display panel according to claim 1, wherein a side of the compensation electrode and a side of the pixel definition opening has a preset distance therebetween.

3. The display panel according to claim 1, wherein the display panel has a plurality of the contact holes defined in a middle region and a frame region thereof away from the middle region, a density of a distribution of the contact holes defined in the middle region of the display panel is greater than that of the contact holes defined in the frame region of the display panel.

4. The display panel according to claim 1, wherein a distance between a surface of the compensation electrode facing to the array substrate and the array substrate is equal to a distance of a surface of the anode facing to the array substrate and the array substrate.

5. The display panel according to claim 1, wherein an orthographic projection of the pixel definition layer on the array substrate covers an orthographic projection of the compensation electrode on the array substrate.

6. The display panel according to claim 1, wherein the cathode and the compensation electrode are at least partly overlapped, an overlapping region between the cathode and the compensation electrode is non-transparent.

7. The display panel according to claim 1, wherein the radial dimension of the contact hole varies stepwise from the first end to the second end.

8. The display panel according to claim 1, wherein the compensation electrode and the cathode are made of the same or different materials, and the pixel definition layer being an organic material layer.

9. The display panel according to claim 1, wherein the array substrate comprises a planarization layer, the anode being formed on the planarization layer, and a distance from the planarization layer to an upper surface of the pixel definition layer away from the array substrate is greater than a distance from the planarization layer to an upper surface of the anode away from the array substrate.

10. A method for manufacturing a display panel, the display panel comprising a plurality of pixel definition opening regions and a spacing region located between two adjacent pixel definition opening regions of the plurality of pixel definition opening regions, the method for manufacturing the display panel comprising:
    providing an array substrate;
    forming an anode on the array substrate, the anode corresponding to a pixel definition opening region;
    forming a compensation electrode in the spacing region;
    forming a pixel definition layer covering the compensation electrode and defining the pixel definition openings, wherein the pixel definition layer defines at least a contact hole exposing at least a part of the compensation electrode; and
    forming a cathode covering the pixel definition layer, and contacting the cathode with the compensation electrode via the contact hole to form a three-dimensional mesh structure for impact dispersion;
    wherein the contact hole has a first end away from the compensation electrode and a second end adjacent to the compensation electrode, the contact hole tapers downwardly from the first end to the second end to provide enhanced contact between the cathode and the compensation electrode; and
    wherein a distance between a part of an upper surface of the pixel definition layer corresponding to the compensation electrode and the array substrate is greater than a distance between a rest upper surface of the pixel definition layer and the array substrate.

11. The method for manufacturing the display panel according to claim 10, wherein the forming the compensation electrode in the spacing region comprises:

forming the compensation electrode in the spacing region by evaporation or printing.

12. The method for manufacturing the display panel according to claim 10, wherein the forming the pixel definition layer covering the compensation electrode and defining the pixel definition opening comprises:
    forming the pixel definition layer by coating or inkjet printing, and patterning the pixel definition layer to form the pixel definition openings and the contact hole.

13. The method for manufacturing the display panel according to claim 12, wherein patterning the pixel definition layer comprises exposing the pixel definition layer with a mask and developing the same.

14. The display panel according to claim 1, wherein the pixel definition layer comprises an inorganic material selected from the group consisting of tin oxide, silicon nitride, and tin oxynitride.

15. The display panel according to claim 1, further comprising:
    a polarizer coupled to a light-emitting side of the display panel.

16. The display panel according to claim 1, wherein the radial dimension of the contact hole linearly changes from the first end to the second end.

* * * * *